United States Patent [19]
Kozuka

[11] Patent Number: 6,002,157
[45] Date of Patent: Dec. 14, 1999

[54] SEMICONDUCTOR DEVICE HAVING A CMOS CURRENT MIRROR CIRCUIT

[75] Inventor: Hiraku Kozuka, Hiratsuka, Japan

[73] Assignee: Canon Kabushiki Kaisha, Tokyo, Japan

[21] Appl. No.: 09/247,949

[22] Filed: Feb. 11, 1999

[30] Foreign Application Priority Data

Feb. 20, 1998 [JP] Japan .................................. 10-038871
Sep. 24, 1998 [JP] Japan .................................. 10-270091

[51] Int. Cl.[6] .......................... H01L 29/76; H01L 29/94; H01L 31/062; H01L 31/113
[52] U.S. Cl. .......................... 257/369; 257/290; 257/292; 257/379; 250/338.4; 250/370.15
[58] Field of Search ..................................... 257/369, 379, 257/290, 292; 250/338.4, 370.15

[56] References Cited

U.S. PATENT DOCUMENTS

| | | | |
|---|---|---|---|
| 5,453,629 | 9/1995 | Gofuku et al. | 257/186 |
| 5,481,124 | 1/1996 | Koruka et al. | 257/185 |
| 5,677,201 | 10/1997 | Koruka et al. | 437/3 |
| 5,705,807 | 1/1998 | Throngnumchai et al. | 250/214 |
| 5,861,655 | 1/1999 | Koruka et al. | 257/446 |
| 5,896,043 | 4/1999 | Kumagai | 326/68 |

FOREIGN PATENT DOCUMENTS

| | | |
|---|---|---|
| 4-223771 | 8/1992 | European Pat. Off. . |
| 7-44254 | 1/1995 | European Pat. Off. . |
| 9-65215 | 3/1997 | European Pat. Off. . |

OTHER PUBLICATIONS

Gregorian et al., "Analog MOS Integrated Circuits for Signal Processing", MOS Operational Amplifiers, pp. 121–131, Wiley & Sons, 1986.

*Primary Examiner*—Ngân V. Ngô
*Attorney, Agent, or Firm*—Fitzpatrick, Cella, Harper & Scinto

[57] ABSTRACT

In a photoelectric conversion device driven by a current mirror circuit, the current mirror circuit is constituted by four transistors, e.g., first and second PMOS transistors and first and second NMOS transistors. A photodiode which has a cathode connected to the drain of the second PMOS transistor and receives reverse bias is arranged. Electrons generated in the photodiode can prevent potential rise of a node connected to the photodiode to normally operate the photoelectric conversion device even upon irradiation of light.

42 Claims, 12 Drawing Sheets

100 : MULTISENSOR
132 : CERAMIC BOARD
133 : CHIP COATING AGENT
134 : LENZ ARRAY
135 : LED LIGHT SOURCE
136 : SUPPORT
137 : HOUSING

SEMICONDUCTOR DEVICE HAVING A CMOS CURRENT MIRROR CIRCUIT

BACKGROUND OF THE INVENTION

1. Field of the Invention

The present invention relates to a semiconductor device having, for example, a current mirror circuit, a photoelectric conversion device, and an image reading apparatus and, more particularly, to a photoelectric conversion device having, e.g., a CMOS current mirror constant current source circuit, and an image reading apparatus having a multisensor in which a plurality of photoelectric conversion devices are arranged.

2. Description of the Related Art

In recent years, in the field of photoelectric conversion devices, one in which a light-receiving element and its peripheral circuit are formed on a single substrate has be-en extensively developed.

Examples of such a photoelectric conversion device are a linear sensor in which an operational amplifier and light-receiving element are formed on a single semiconductor substrate (Journal of Television Society, Vol. 47, No. 9 (1993), p. 1,180), an image sensor having a sample-and-hold circuit (Japanese Patent Laid-Open No. 4-223771), and a solid-state image sensor having an internal reference voltage generation circuit constituted by an operational amplifier (Japanese Patent Laid-Open No.9-65215).

A bias current for an operational amplifier is generally generated using a constant current source circuit. When this constant current source circuit is formed using a MOS transistor, a CMOS constant current source circuit (R. Gregorian and G. C. Temes, Analog MOS Integrated Circuits for Signal Processing, p. 127, FIGS. 4 and 5) like the one shown in FIG. 10 is generally employed. In addition, a CMOS constant current source circuit like the one disclosed in Japanese Patent Laid-Open No. 7-44254 is proposed.

Operation of a conventional CMOS constant current circuit will be described with reference to FIG. 10.

FIG. 10 shows the state in which power supply voltage is applied to the conventional CMOS constant current circuit that constitutes a current mirror circuit. Referring to FIG. 10, a current flowing from the drain of Q3 to the drain of Q2 is equal to a constant current flowing from the drain of Q4 to the drain of Q1. In general, the constant current circuit stabilizes while the constant current flows (the MOS transistors Q2 and Q4 operate in a saturation region in FIG. 10).

FIG. 11 is a plan view showing the pattern of the conventional constant current circuit (FIG. 10). FIG. 12 is a schematic sectional view taken along the line A–A' in FIG. 11. The NMOSs Q1 and Q2 and PMOSs Q3 and Q4 in FIG. 10 correspond to NMOSs 104 and 103 and PMOSs 101 and 102 in FIG. 11, respectively.

As is apparent from FIGS. 11 and 12, the conventional PMOS and NMOS have substantially the same opening area of the drain region.

However, in a photoelectric conversion device in which the CMOS constant current circuit disclosed in the prior art and a light-receiving element are formed on a single semiconductor substrate, the CMOS constant current circuit may fail to operate upon irradiation of light. More specifically, the CMOS constant current circuit may stabilize while almost no constant current flows ($V_{01} \approx V_{DD}$, $V_{02} \approx GND$ in FIG. 10). In this state, since $V_{01}$ and $V_{DD}$ have substantially no potential difference, almost no bias current flows, so the circuit does not operate normally.

This reason will be described.

For example, when photocarriers are generated at a p-n junction formed by the drain (P type) of the PMOS transistor Q3 and a substrate (well: N type), emission holes are accumulated in $V_{01}$ in FIG. 10. As a result, the potential of $V_{01}$ rises to turn off the PMOS transistors Q3 and Q4. Accordingly, the potential of $V_{02}$ falls, and the constant current circuit finally stabilizes while almost no constant current flows.

Also when photocarriers are generated at a p-n junction formed by the drain (N type) of the NMOS transistor Q1 and a well (P type), emission electrons generated in Q1 are accumulated in $V_{02}$, and thus the potential of $V_{02}$ falls. The constant current circuit stabilizes while almost no constant current flows, and fails to operate normally. Hence, when the constant current circuit cannot be satisfactorily shielded from light under limitations on the pattern layout and design rule of a semiconductor substrate, the constant current circuit fails to operate normally.

SUMMARY OF THE INVENTION

The present invention has been made to solve the above problems, and has as its object to provide a semiconductor device having, for example, a CMOS current mirror circuit which normally operates even upon irradiation of light, a photoelectric conversion device having this device, and an image reading apparatus having a multisensor in which a plurality of photoelectric conversion devices are arranged.

In the following description, only one current mirror circuit will be exemplified even when two current mirror circuits are series-connected.

To achieve the above object, a photoelectric conversion device according to the present invention has the following arrangement.

That is, a photoelectric conversion device is characterized by comprising a photoelectric conversion element driven by a current mirror circuit, the current mirror circuit having a first PMOS transistor (2) having a source connected to a positive power supply, a second PMOS transistor (1) having a source connected to the positive power supply and a gate and drain connected to a gate of the first PMOS transistor, a first NMOS transistor (4) having a source connected to a reference potential and a gate and drain connected to a drain of the first PMOS transistor, and a second NMOS transistor (3) having a source connected to the reference potential via a resistor, a gate connected to the gate of the first NMOS transistor, and a drain connected to the drain of the second PMOS transistor, the current mirror circuit having a photodiode (5) with a cathode connected to the drain of the second PMOS transistor.

At this time, the photodiode desirably receives a reverse bias between the drain of the second PMOS transistor and the reference potential.

Alternatively, the current mirror circuit may have a photodiode (5) having an anode connected to the drain of the first NMOS transistor, and the photodiode may receive a reverse bias between the drain of the first NMOS transistor and the positive power supply.

Either current mirror circuit is connected to a plurality of photoelectric conversion elements to constitute a multisensor (101, 101', 101"), thereby realizing an image reading apparatus having the multisensor as a sensor for reading an image.

To achieve the above object, a semiconductor device according to the present invention has the following arrangement.

That is, a semiconductor device is characterized by comprising a control circuit (20; 20A) constituted by at least a first region of a first conductivity type and a second region of a second conductivity type, the control circuit including a semiconductor element (5) in which when a potential variation occurs in either one of the first and second regions by external disturbance of the semiconductor device, a potential variation opposite to the potential variation is caused.

Preferably, the control circuit constitutes a current mirror circuit by a plurality of PMOS transistors (1, 2) forming the first region of the first conductivity type and a plurality of NMOS transistors (3, 4) forming the second region of the second conductivity type, and the semiconductor device functions as a photoelectric conversion device by the current mirror circuit and a photoelectric conversion circuit connected to the circuit.

To achieve the above object, a photoelectric conversion device according to the present invention has the following arrangement.

That is, a photoelectric conversion device is characterized by comprising a photoelectric conversion element driven by a current mirror circuit, the current mirror circuit having a first PMOS transistor (2) having a source connected to a positive power supply, a second PMOS transistor (1) having a source connected to the positive power supply and a gate and drain connected to a gate of the first PMOS transistor, a first NMOS transistor (4) having a source connected to a reference potential and a gate and drain connected to a drain of the first PMOS transistor, and a second NMOS transistor (3) having a source connected to the reference potential via a resistor, a gate connected to the gate of the first NMOS transistor, and a drain connected to the drain of the second PMOS transistor, wherein when light is incident on the photoelectric conversion element, a current (photocurrent) generated in a drain region of the first PMOS transistor is larger than a current (photocurrent) generated in a drain region of the first NMOS transistor.

In addition, for example, the opening area of the drain region of the first PMOS transistor is desirably larger than the opening area of the drain region of the first NMOS transistor. Alternatively, when light is incident on the photoelectric conversion element, a photocurrent generated in the drain region of the second NMOS transistor is larger than a photocurrent generated in the drain region of the first PMOS transistor. In this case, the opening area of the drain region of the first PMOS transistor is preferably larger than the opening area of the drain region of the first NMOS transistor.

Other features and advantages of the present invention will be apparent from the following description taken in conjunction with the accompanying drawings, in which like reference characters designate the same or similar parts throughout the figures thereof.

DETAILED DESCRIPTION OF THE PREFERRED EMBODIMENTS

Embodiments of the present invention will be described in detail below with reference to the accompanying drawings.
[First Embodiment]

Figure 1:
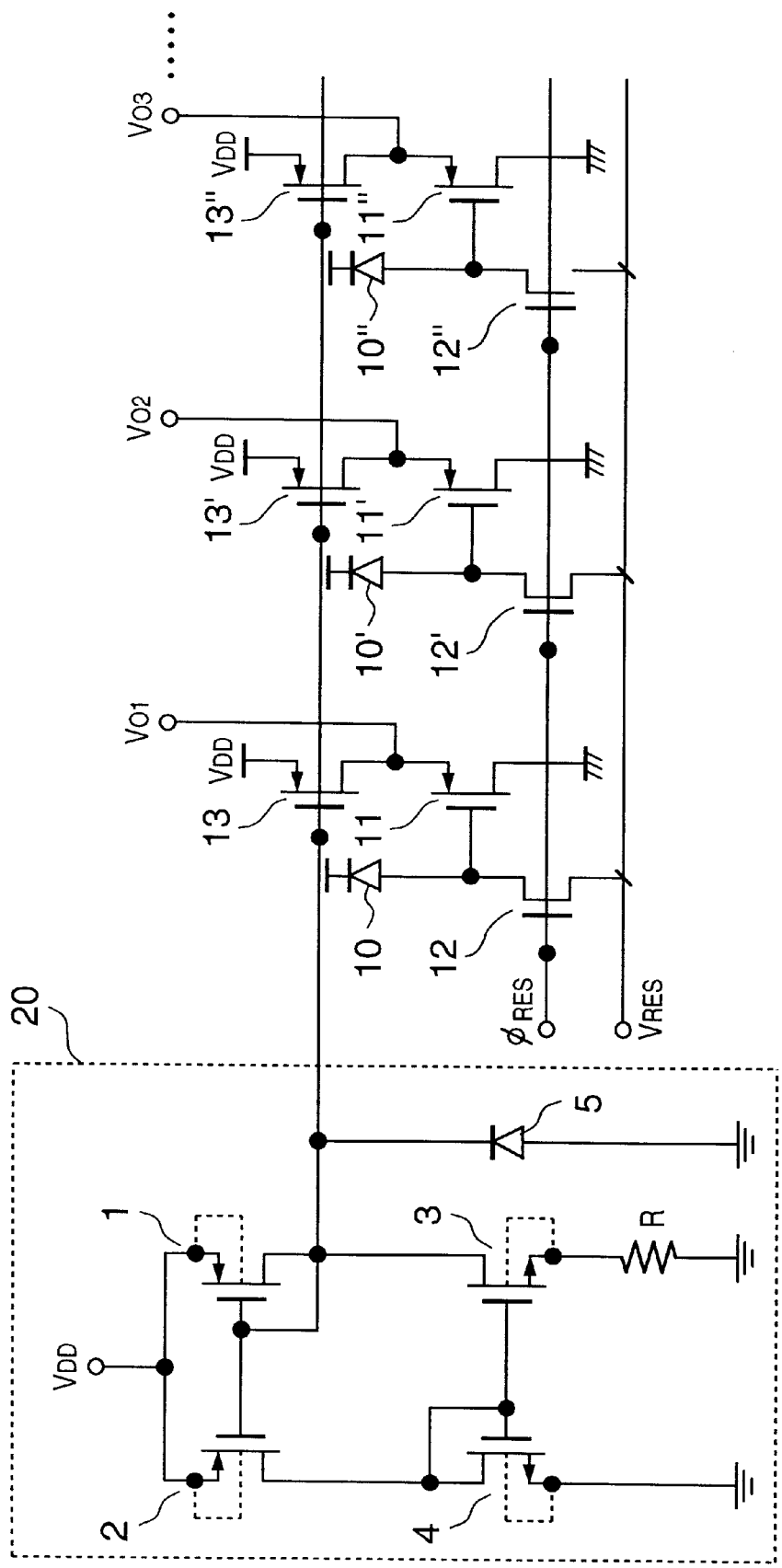
FIG. 1 is an equivalent circuit diagram of three pixels in the first embodiment of the present invention.

FIG. 1 is an equivalent circuit diagram of three pixels in a photoelectric conversion device according to the first embodiment of the present invention.

In the equivalent circuit shown in FIG. 1, photodiodes 10, 10', and 10" serving as photoelectric conversion elements, the gates of PMOS transistors 11, 11', and 11", and reset switches 12, 12', and 12" are connected. Signal charges generated in the photodiodes 10, 10', and 10" are read out from the PMOS transistors 11, 11', and 11" by a source follower. This source follower uses the constant current loads of PMOS transistors 13, 13', and 13". A constant current source is connected to the gates of the PMOS transistors 13, 13', and 13".

In the photoelectric conversion device shown in FIG. 1, a reset pulse φRES changes to high level to turn on the reset switches 12, 12', and 12". Accordingly, the anodes of the photodiodes 10, 10', and 10" are reset to a reset potential VRES at once. The photodiodes 10, 10', and 10" are irradiated with external video light for a predetermined time. Then, the anode potentials of the photodiodes 10, 10', and 10" fall to be equal to or lower than the thresholds of the PMOS transistors 11, 11', and 11" in accordance with the irradiated quantity of video light. The PMOS transistors 11, 11', and 11" are turned on to flow a current corresponding to the quantity of video light. A voltage corresponding to this current is output as an output voltage to output voltages $V_{O1}$, $V_{O2}$, and $V_{O3}$.

In the constant current source 20 for generating the current of the constant current load, a current mirror circuit is constituted by a first PMOS transistor 2 which has a source connected to a positive power supply, a second PMOS transistor 1 which has a source connected to the positive power supply and a gate and drain connected to the gate of the first PMOS transistor 2, a first NMOS transistor 4 which has a source connected to a negative power supply and a gain and drain connected to the drain of the first PMOS transistor, and a second NMOS transistor 3 which has a source connected to the reference-voltage negative power supply via a resistor R, a gate connected to the gate of the first NMOS transistor, and a drain connected to the drain of the second PMOS transistor. The constant current source 20 comprises a photodiode 5 which has a cathode connected to the drain of the second PMOS transistor 1 and receives a reverse bias. One feature of the constant current source 20 is that the photodiode 5 receives a reverse bias between the drain of the PMOS transistor 1 and GND.

The area and light-shielding ratio of the drain of the PMOS transistor 1, and the area and light-shielding ratio of the photodiode in the first embodiment will be shown.

TABLE 1

|  | Area | Light-Shielding Ratio |
| --- | --- | --- |
| Drain of PMOS (1) | 180 $\mu m^2$ | 65% |
| Photodiode (5) | 180 $\mu m^2$ | 20% |

In this case, the PMOSs 1 and 2 of the constant current source 20 flow a constant current of about 20 $\mu A$, whereas the photodiode 5 flows a photocurrent of 1 pA or less upon irradiation of light. Therefore, the photocurrent of the photodiode 5 does not influence the precision of the constant current source.

According to the first embodiment, even when photocarriers are generated at a p-n junction formed by the drain (P type) of the NMOS transistor 1 and the well (N type), electrons generated in the photodiode 5 can suppress any potential rise of the node connected to the photodiode 5. For this reason, the PMOS transistors 1 and 2 can be prevented from turning off, and the constant current source circuit stabilizes in a normal state.

In the first embodiment, even when the power supply voltage is applied upon irradiation of light, the constant current source 20 operates normally, and the photoelectric conversion device shown in FIG. 1 exhibits normal light reaction. However, in a conventional constant current source circuit using no photodiode 5, the constant current source circuit is kept off even upon application of the power supply voltage, and the photoelectric conversion device does not exhibit light reaction.

Note that FIG. 1 shows only an equivalent circuit for three pixels. In practice, the first embodiment is a one-dimensional line sensor chip constituted by 234 pixels per chip, and a multisensor is formed by connecting a plurality of such one-dimensional line sensor chips in a line. The multisensor will be described later with reference to FIG. 8.

[Second Embodiment]

Figure 2:
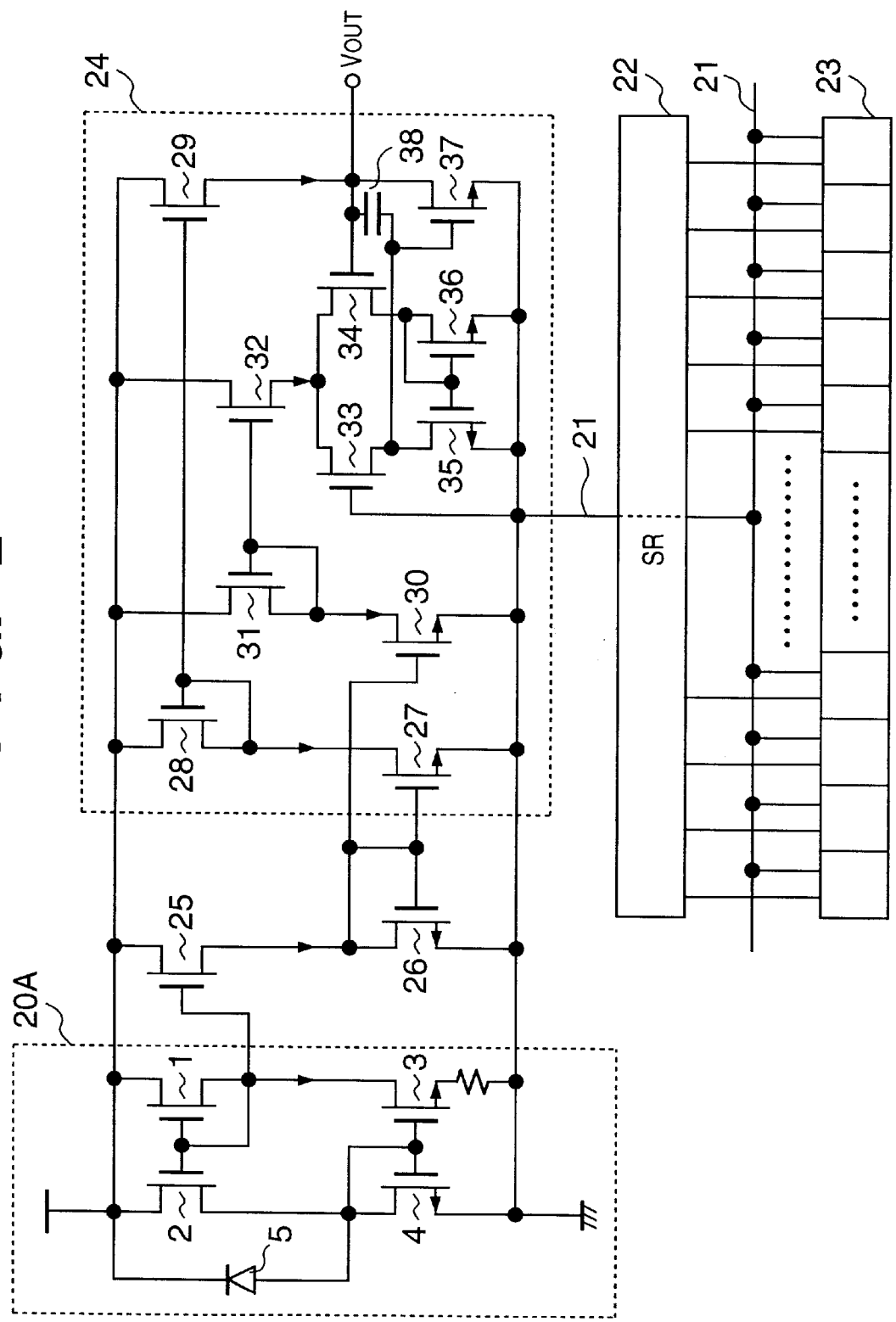
FIG. 2 is an equivalent circuit diagram in the second embodiment of the present invention.

FIG. 2 is an equivalent circuit diagram in the second embodiment of the present invention. A photoelectric conversion device according to the second embodiment performs impedance conversion for an output from a common output line 21 of a light-receiving element array 23 using an operational amplifier 24, and outputs the converted signal.

In a constant current source 20A according to the second embodiment, a current mirror circuit is constituted by a first PMOS transistor 2 which has a source connected to a positive power supply, a second PMOS transistor 1 which has a source connected to the positive power supply and a gate and drain connected to the gate of the first PMOS transistor 2, a first NMOS transistor 4 which has a source connected to a negative power supply and a gain and drain connected to the drain of the first PMOS transistor 2, and a second NMOS transistor 3 which has a source connected to the negative power supply via a resistor, a gate connected to the gate of the first NMOS transistor 4, and a drain connected to the drain of the second PMOS transistor 1. The constant current source 20A comprises a photodiode 5 which has an anode connected to the drain of the first NMOS transistor 4 and receives a reverse bias.

According to the second embodiment, even when photocarriers are generated at a p-n junction formed by the drain (N type) of the NMOS transistor 4 and the well (P type), holes generated in the photodiode 5 can suppress any potential drop of the node connected to the photodiode. As a result, the NMOS transistors 3 and 4 can be prevented from turning off, and the constant current source circuit stabilizes in a normal state.

Signal outputs photoelectrically converted by respective light-receiving elements of the light-receiving element array 23 are sequentially output to the common output line 21 via a shift register 22. The common output line 21 is connected to the input of the operational amplifier 24. In the second embodiment, the photodiode 5 is arranged between the drain of the NMOS transistor 4 of the constant current source 20A and the power supply voltage so as to receive a reverse bias.

The operational amplifier 24 is connected to the gate of a PMOS 25 connected to the output of the constant current source 20A. The drain of the PMOS 25 flows a current identical to the drain current of the PMOS 1 by a current mirror effect. This current is mapped to NMOSs 26, 27, and 30 of a current mirror circuit connected to the drain of the PMOS 25, PMOSs 28 and 29 of a current mirror circuit serving as a load connected to the drain of the NMOS 27, and PMOSs 31 and 32 of a current mirror circuit connected to the drain of the NMOS 30. As a result, the drain of the PMOS 32 flows a current identical to the drain current of the PMOS 1. A signal output from the light-receiving element array 23 is input to the gate of a PMOS 33, and the drain of the PMOS 33 inputs a reverse output to the gate of an NMOS 37 on the output side. Consequently, an image signal output Vout in phase with the signal output from the light-receiving element array 23 can be obtained. Note that NMOSs 35 and 36 function as loads of differential PMOSs 33 and 34 on the input side, and a capacitor 38 operates to compensate for the phase of the operational amplifier.

In the second embodiment, even when the power supply voltage is applied to the constant current source 20A upon irradiation of light, the constant current source 20A operates normally. The constant current source 20A can supply a bias current to the operational amplifier 24, and thus the photoelectric conversion device shown in FIG. 2 can output an output voltage by light reaction.

To the contrary, in a photoelectric conversion device using a conventional constant current source circuit without any photodiode 5, the constant current source circuit is kept off even upon application of power supply voltage in irradiation of light. Consequently, the constant current source circuit cannot supply any bias current to the operational amplifier 24, and the photoelectric conversion device cannot output any signal output voltage, like the case in which the apparatus does not exhibit light reaction.

Also in the second embodiment, the reverse biasing photodiode 5 may be arranged between the drain and source of the NMOS 3. A line sensor of the second embodiment may be constituted by one chip. The present invention is not limited to a constant current source and may employ a differential amplifier circuit or another circuit. If the present invention adopts an element capable of canceling electrons and holes of photocarriers generated at a p-n junction, malfunction caused by the influence of disturbance of light or the like can be prevented. As for the component, a CMOS, MOSFET, or bipolar transistor may be used, and the present invention can be applied as a semiconductor device.

A light-receiving element array used in the second embodiment is formed into one sensor chip, and a plurality of such sensor chips are aligned in a line to form a contact image sensor. A direction along the line of this contact image sensor is defined as a main scanning direction, and a direction perpendicular to the main scanning direction is defined as a subscanning direction. The image sensor is scanned in the subscanning direction with respect to an image to be read, thereby reading a two-dimensional image. By outputting the two-dimensional image signal read as a function of the image reading apparatus, this apparatus can be used for, e.g., a scanner, facsimile device, or electronic copying machine, and can read a high-resolution, high-density image.

As described above, the first and second embodiments are applied to the optical charge voltage amplifier circuit of, e.g., a photoelectric conversion element having a constant current source. Even when the constant current source is irradiated with light, this source can be prevented from saturating upon application of power supply voltage, and thus can operate normally. Therefore, the photoelectric conversion device having the CMOS constant current source can be realized, which provides great effects.

In addition, the semiconductor device can be prevented from malfunctioning by the influence of disturbance of light or the like.

In the first and second embodiments, if a photocurrent flowing through the photodiode 5 is larger than a photocurrent generated by the drains of the four MOS transistors and the well that constitute the constant current source, the effects are satisfactorily enhanced. However, if the photocurrent flowing through the photodiode 5 is too large, it decreases the current precision of the constant current source circuit, and undesirably changes the constant current between a dark state and a light irradiation state. Thus, in these embodiments, the photocurrent flowing through the photodiode 5 is preferably much smaller than the current flowing through the constant current circuit.

Note that more desirable operation can be realized by adopting MOS transistors in the third or fourth embodiment (to be described below) for the MOS transistors constituting the constant current sources 20 —and 20A described in the first and second embodiments.

[Third Embodiment]

Figure 3:
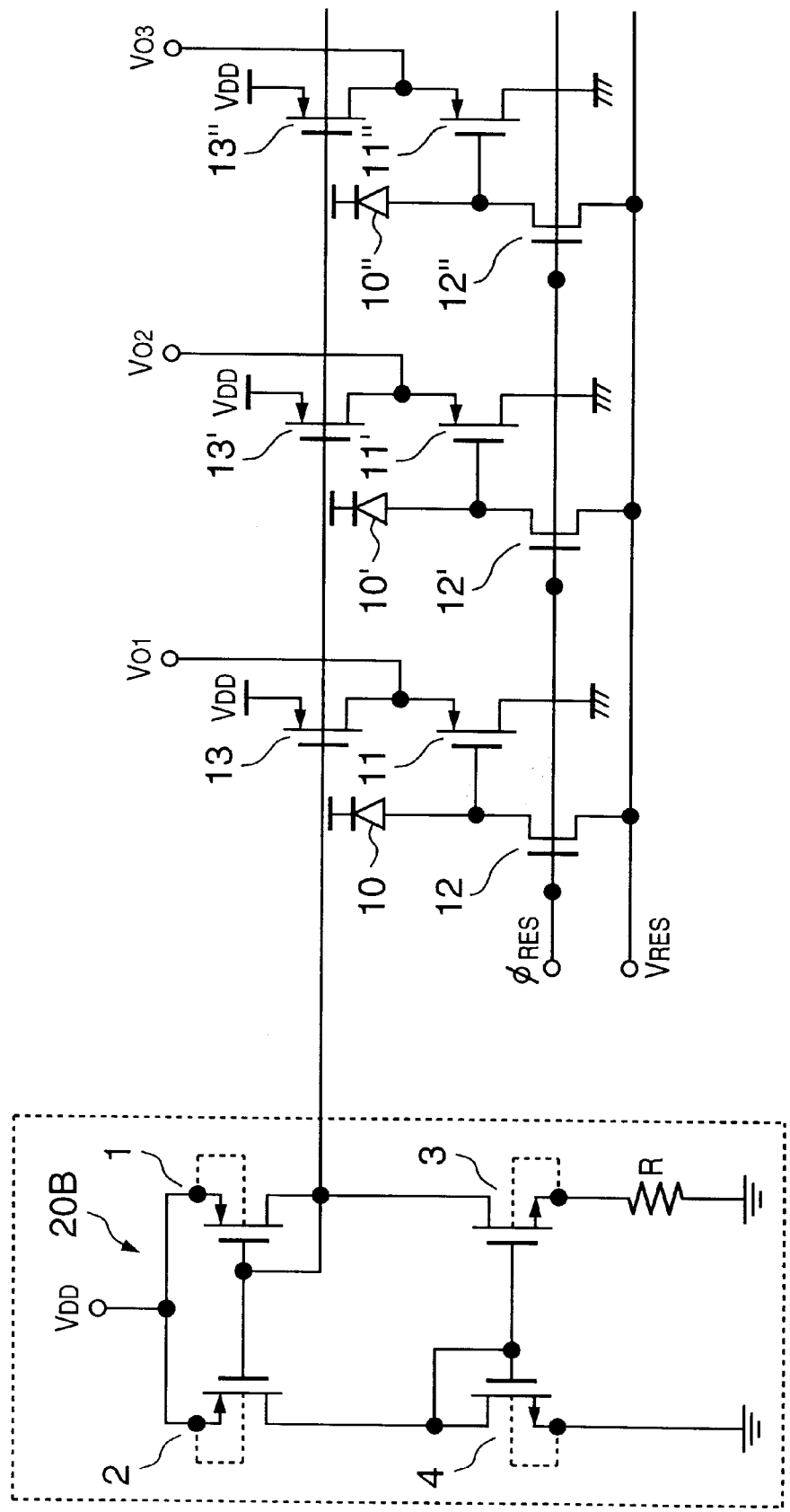
FIG. 3 is an equivalent circuit diagram of three pixels in a photoelectric conversion device according to the third embodiment of the present invention.
Figure 4:
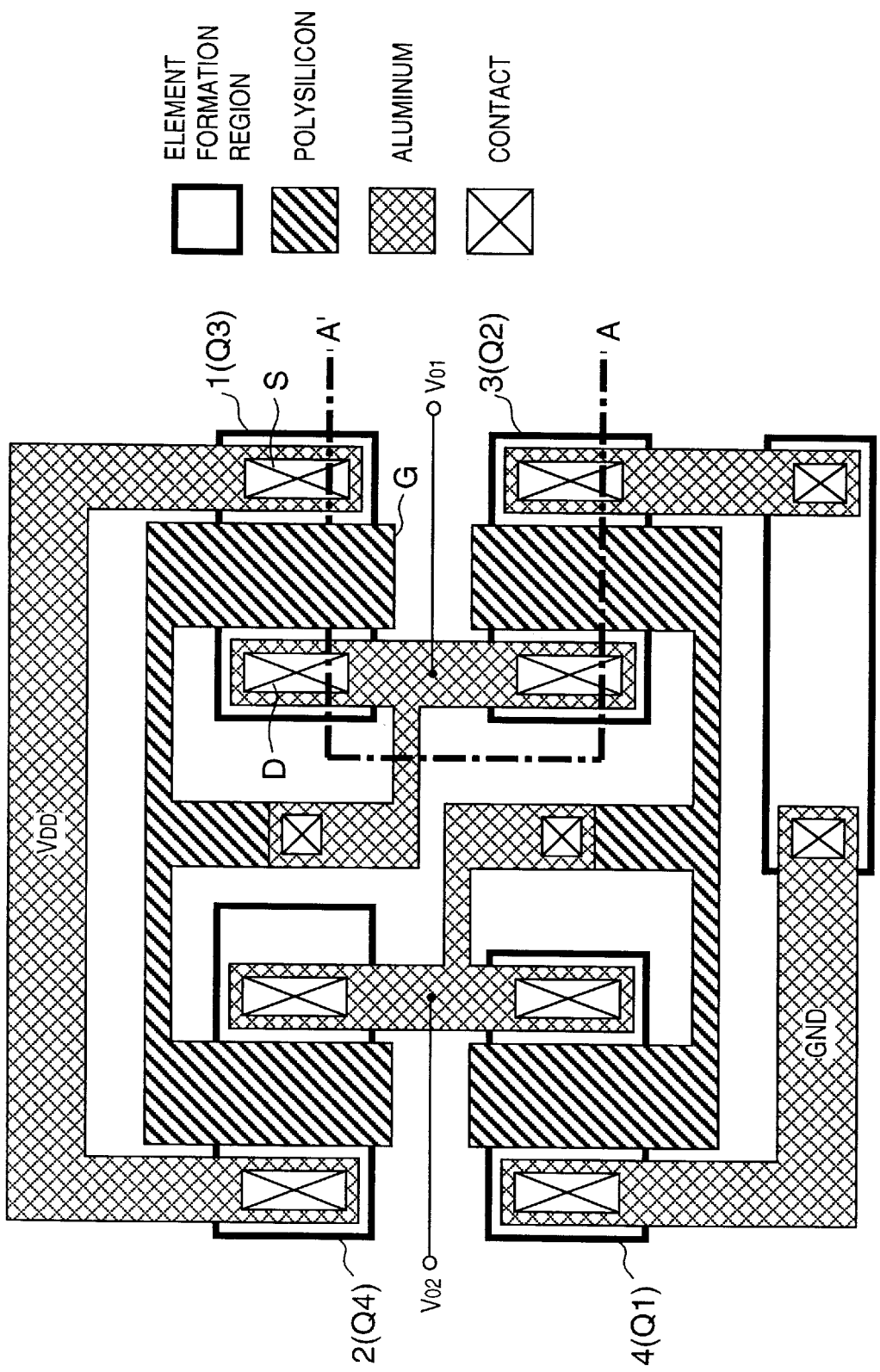
FIG. 4 is a plan view of the pattern of a constant current circuit used in the third embodiment of the present invention.

FIG. 3 is an equivalent circuit diagram of three pixels in a photoelectric conversion device according to the third embodiment of the present invention. FIG. 4 is a plan view of the pattern of a constant current circuit used in the photoelectric conversion device of the present invention.

As shown in FIG. 4, in the photoelectric conversion device of the third embodiment, photodiodes 10, 10', and 10", the gates of PMOSs 11, 11', and 11", and reset switches 12, 12', and 12" are connected. Signal charges generated in the photodiodes are read out from the PMOSs 11, 11', and 11" by a source follower. This source follower uses the constant current loads of PMOS transistors 13, 13', and 13". A constant current source 20B is connected to the gates of the PMOS transistors 13, 13', and 13".

In the photoelectric conversion device shown in FIG. 3, a reset pulse φRES changes to high level to turn on the reset switches 12, 12', and 12". Accordingly, the anodes of the photodiodes 10, 10', and 10" are reset to a reset potential VRES at once. The photodiodes 10, 10', and 10" are irradiated with video light for a predetermined time. Then, the anode potentials of the photodiodes 10, 10', and 10" fall to be equal to or lower than the thresholds of the PMOS transistors 11, 11', and 11", in accordance with the irradiated quantity of video light. The PMOS transistors 11, 11', and 11" are turned on to flow a current corresponding to the quantity of video light. A voltage corresponding to this current is output as an output voltage to output voltages $V_{O1}$, $V_{O2}$, and $V_{O3}$.

The constant current source 20B for generating the current of the constant current load is a current mirror circuit constituted by a first PMOS transistor 2 which has a source connected to a positive power supply, a second PMOS transistor 1 which has a source connected to the positive power supply and a gate and drain connected to the gate of the first PMOS transistor 2, a first NMOS transistor 4 which has a source connected to a reference potential point and a gain and drain connected to the drain of the first PMOS transistor 2, and a second NMOS transistor 3 which has a source connected to the reference potential point via a resistor, a gate connected to the gate of the first NMOS transistor 4, and a drain connected to the drain of the second PMOS transistor.

FIG. 4 is a plan view showing the pattern of the constant current circuit according to the third embodiment. As shown in FIG. 4, the drain region of the first PMOS transistor 2 is larger than the drain region of the first NMOS transistor 4. Upon irradiation of light, holes generated in the drain region of the first PMOS transistor 2 are larger in number than electrons generated in the drain region of the first NMOS transistor 4, and the gate potentials of the NMOS transistors 3 and 4 rise. This allows the constant current circuit to operate normally.

More specifically, in a conventional photoelectric conversion device using a constant current circuit in which the drain regions of respective transistors are equal in size, the malfunction rate is as high as about 10%. To the contrary, the constant current circuit of the third embodiment operates completely normally.

The constant current circuit is not limited to a current mirror circuit used in the third embodiment, and can be another circuit such as a differential amplifier circuit to prevent particularly malfunction caused by the influence of irradiation of light so long as an element capable of canceling electrons and holes of photocarriers generated at a p-n junction is employed. In addition, the component is not limited to a CMOS used in the third embodiment and may be a field effect transistor such as a MOSFET or a bipolar transistor, and the present invention can be applied as a semiconductor device.

The constant current circuit described in the third embodiment can also be applied to, e.g., a semiconductor circuit having a circuit arrangement in which P- and N-type field effect transistors are series-connected via the drain region, the gate and drain of the P-type field effect transistor are connected to each other, and the opening area of the drain region of the N-type field effect transistor is set larger than that of the P-type field effect transistor.

In this semiconductor circuit, a photocurrent generated in the drain region of the N-type field effect transistor upon irradiation of light becomes larger than a photocurrent generated in the drain region of the P-type field effect transistor. Similar to the current mirror circuit, this semiconductor circuit can operate normally as a constant current circuit.

Note that when the gate and drain of the N-type field effect transistor are connected to each other, the present invention adopts a semiconductor circuit in which the opening area of the drain region of the P-type field effect transistor is set larger than that of the N-type field effect transistor.

[Fourth Embodiment]

Figure 5:
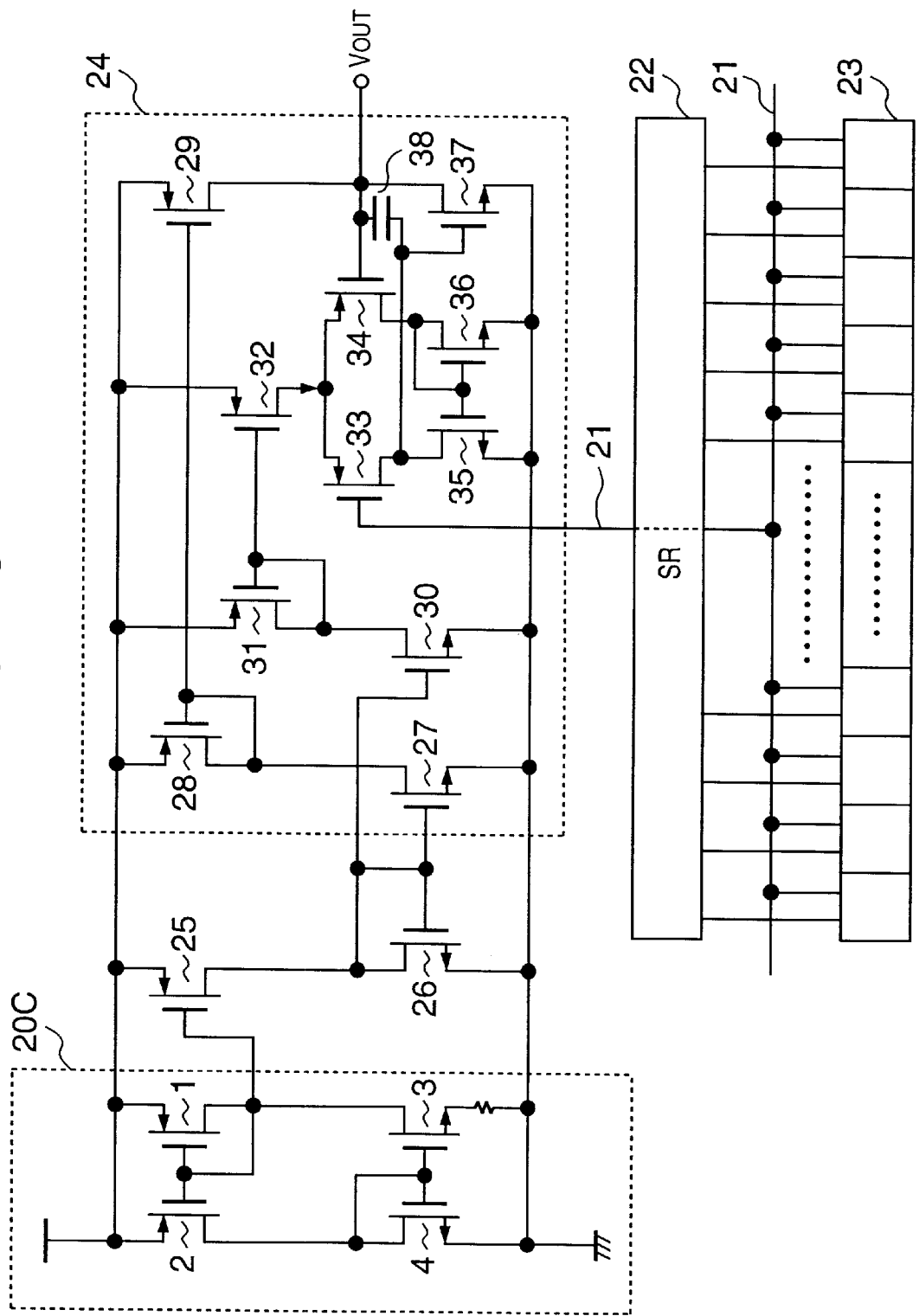
FIG. 5 is an equivalent circuit diagram of a photoelectric conversion device in the fourth embodiment of the present invention.
Figure 6:
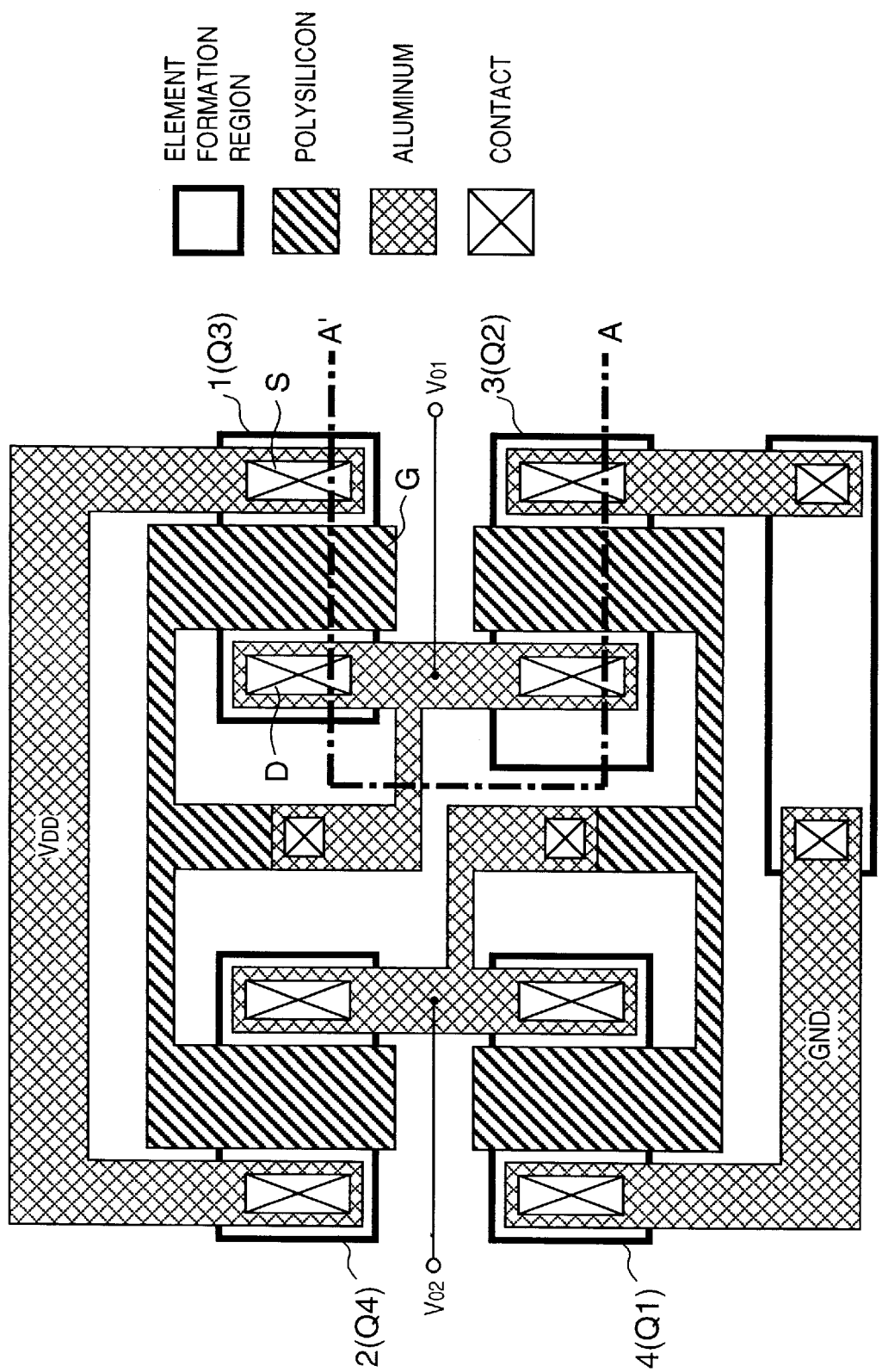
FIG. 6 is a plan view of the pattern of a constant current circuit used in the fourth embodiment of the present invention.
Figure 7:
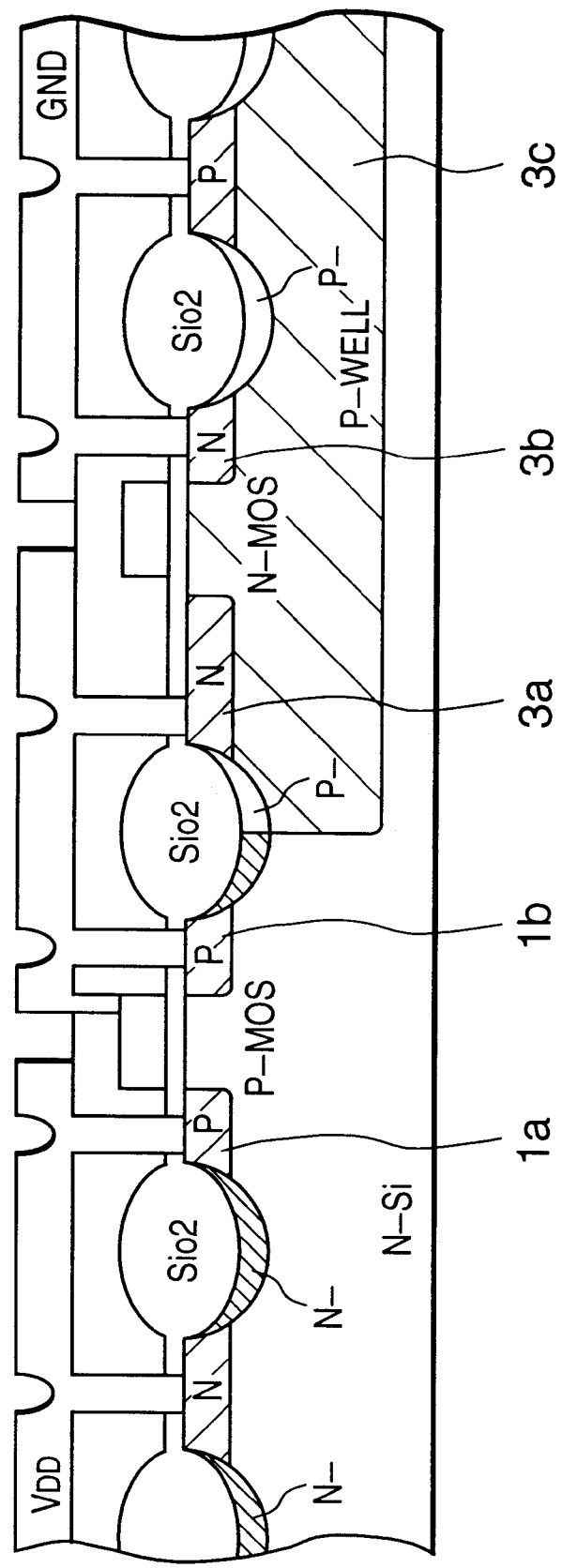
FIG. 7 is a schematic sectional view of a CMOS (second PMOS and NMOS)

FIG. 5 is an equivalent circuit diagram of a photoelectric conversion device according to the fourth embodiment of the present invention. FIG. 6 is a plan view of the pattern of a constant current circuit used in the fourth embodiment. FIG. 7 is a schematic sectional view of a CMOS taken along the line A–A' in FIG. 6.

Connection in a constant current source 20C in FIG. 5 is the same as in the constant current circuit 20B according to the third embodiment, and a description thereof will be omitted.

Operation of the fourth embodiment will be described with reference to FIG. 5. Signal outputs photoelectrically converted by a light-receiving element array 23 are sequentially output to a common output line 21 via a shift register 22. The common output line is connected to the input of an operational amplifier 24.

The operational amplifier 24 is connected to the gate of a PMOS 25 connected to the output of the constant current source 20C. The drain of the PMOS 25 flows a current equal in magnitude to the drain current of a PMOS 1 by a current mirror effect. This current is mapped to NMOSs 26, 27, and 30 of a current mirror circuit connected to the drain of the PMOS 25, PMOSs 28 and 29 of a current mirror circuit serving as a load connected to the drain of the NMOS 27, and PMOSs 31 and 32 of a current mirror circuit connected to the drain of the NMOS 30. As a result, the drain of the PMOS 32 flows a current identical to the drain current of the PMOS 1.

A signal output from the light-receiving element array 23 is input to the gate of a PMOS 33, and the drain of the PMOS 33 inputs a reverse output to the gate of an NMOS 37 on the output side. Consequently, an image signal output Vout in phase with the signal output from the light-receiving element array 23 can be obtained. Note that NMOSs 35 and 36 function as loads of differential PMOSs 33 and 34 on the input side, and a capacitor 38 operates to compensate for the phase of the operational amplifier.

As shown in FIG. 6, according to the fourth embodiment, in the constant current circuit for generating a bias current for the operational amplifier 24, the opening area of the drain region of a second NMOS transistor 3 is set larger than that of the drain region of the first PMOS transistor 2. The opening area of the drain region means a boundary surface between the drain and p-well.

FIG. 7 is a schematic sectional view taken along the line A–A' in FIG. 6. The gate is covered with, e.g., a thin silicon oxide ($SiO_2$) insulating film.

The embodiment of the present invention will be explained with reference to FIG. 7 from another viewpoint different from the planar pattern (FIG. 6) of the constant current circuit. If the opening area of a drain region $3a$ of the first NMOS is large, holes generated between the drain region $3a$ and the well (P type) upon irradiation of light become larger in number than electrons generated in the drain region $1b$ of the first PMOS transistor.

Figure 10:
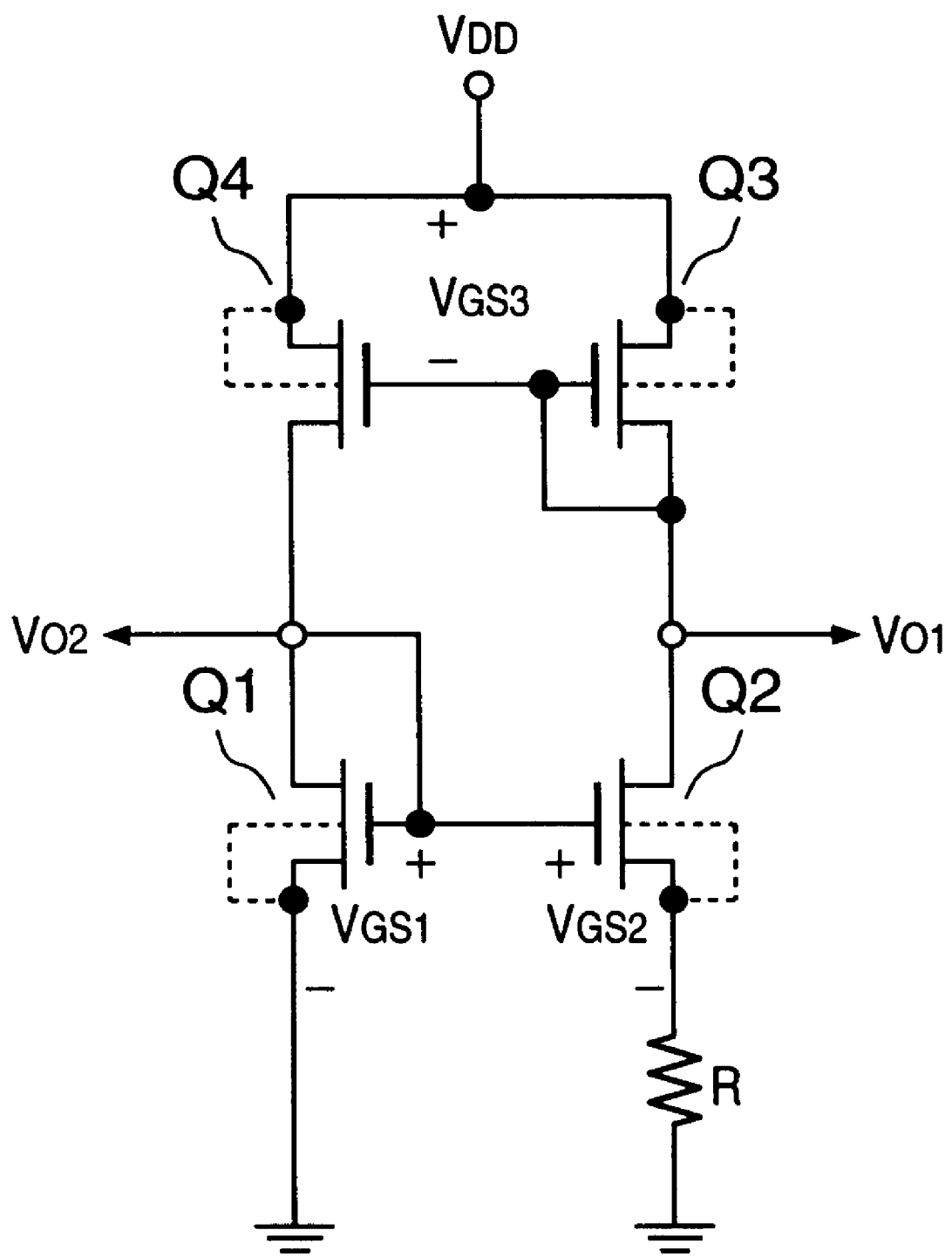
FIG. 10 is an equivalent circuit diagram of a conventional constant current source circuit.
Figure 11:
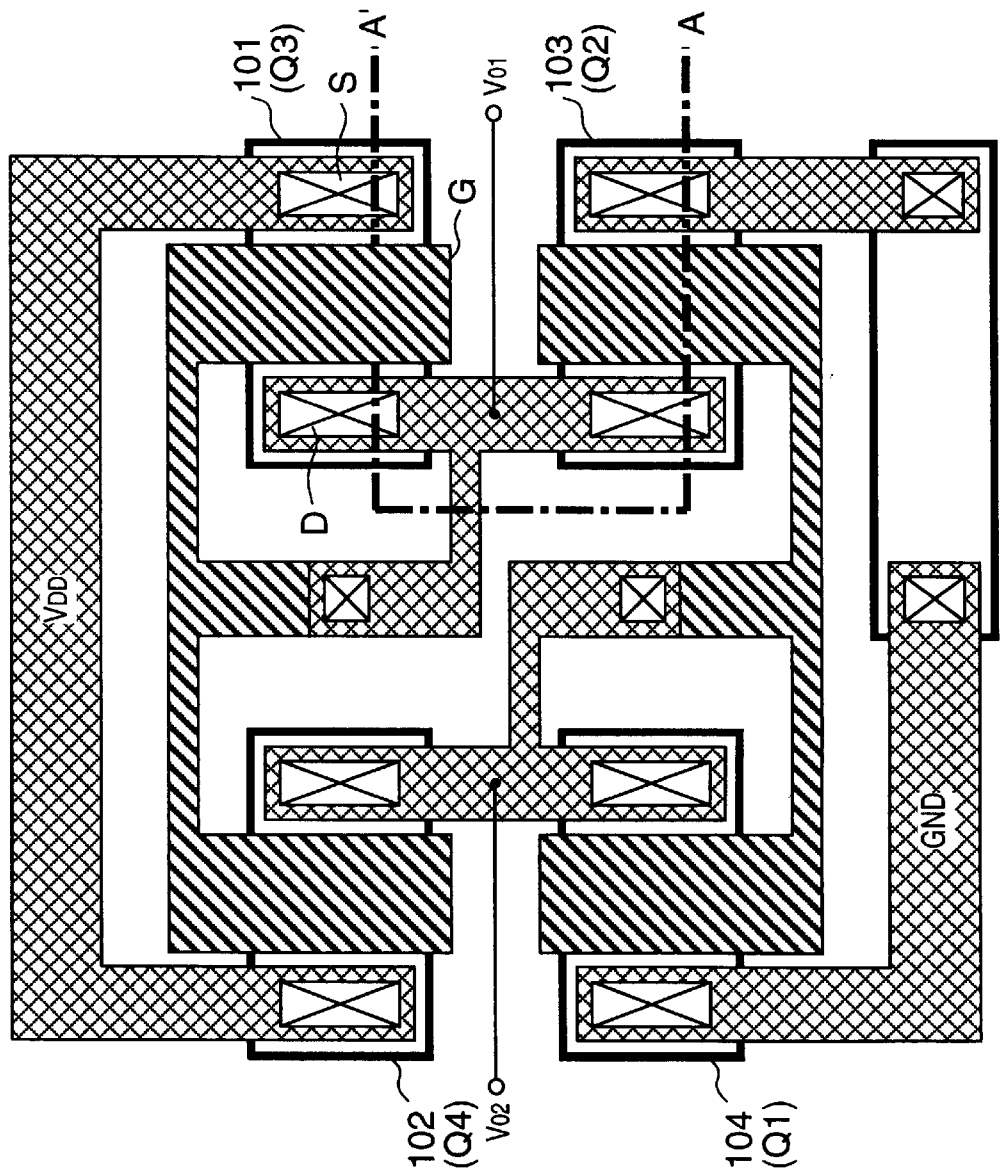
FIG. 11 is a plan view of an example of the pattern of the conventional constant current source circuit.
Figure 12:
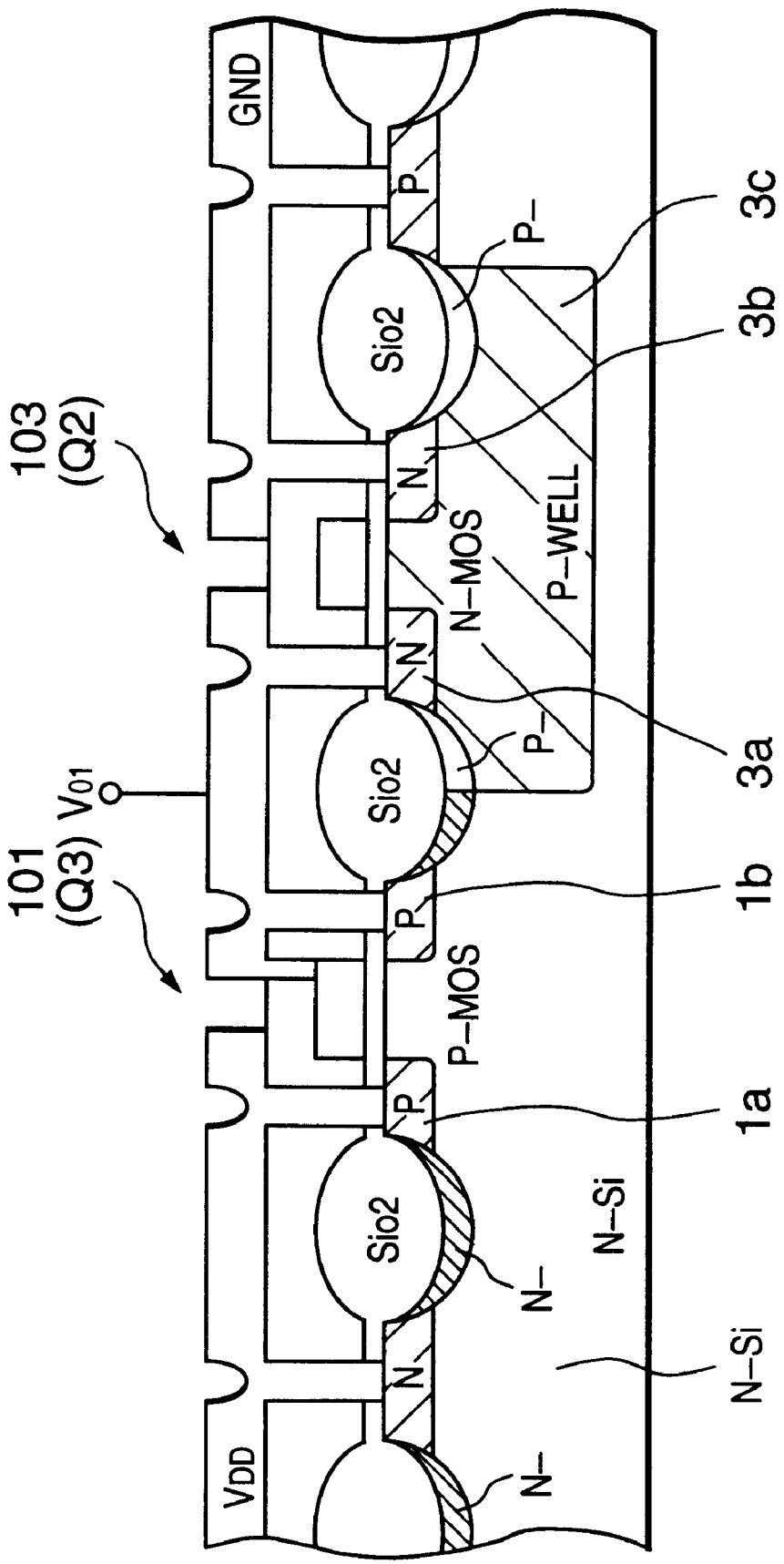
FIG. 12 is a schematic sectional view of a conventional CMOS (second PMOS and NMOS).

In the fourth embodiment, therefore, electrons generated in the drain region of the first NMOS can be increased in number to prevent accumulation of holes generated in $V_{01}$ in the prior art shown in FIG. 10. This can stabilize the CMOS constant current circuit while a constant current flows through it, and can normally operate the photoelectric conversion device.

Further, the conventional problem that the constant current circuit fails to operate normally can be solved similarly to the third embodiment. Since a predetermined voltage is applied to operate the operational amplifier (24 in FIG. 5), the photoelectric conversion device can operate normally.

The constant current circuit is not limited to a current mirror circuit, similar to the above embodiment. Particularly malfunction caused by the influence of irradiation of light can be prevented by using an element for canceling electrons and holes of photocarriers generated at a p-n junction. In addition, the component is not limited to a CMOS and may be a field effect transistor such as a MOSFET or a bipolar transistor, and the present invention can be applied as a semiconductor device.

The constant current circuit described in the fourth embodiment can also be applied to, e.g., a semiconductor circuit having a circuit arrangement in which P- and N-type field effect transistors are series-connected via the drain region, the gate and drain of the P-type field effect transistor are connected to each other, and the opening area of the drain region of the N-type field effect transistor is set larger than that of the P-type field effect transistor.

In this semiconductor circuit, a photocurrent generated in the drain region of the N-type field effect transistor upon irradiation of light becomes larger than a photocurrent generated in the drain region of the P-type field effect transistor. Similar to the current mirror circuit, this semiconductor circuit can operate normally as a constant current circuit.

Note that when the gate and drain of the N-type field effect transistor are connected to each other, the present invention adopts a semiconductor circuit in which the opening area of the drain region of the P-type field effect transistor is set larger than that of the N-type field effect transistor.

In the fourth embodiment, if a photocurrent generated in the drain of the MOS transistor and the well that constitute the constant current circuit is too large, it decreases the current precision of the constant current source circuit, and undesirably changes the constant current between a dark state and a light irradiation state. Thus, the photocurrent flowing through the drain region of the MOS transistor is preferably much smaller than the current flowing through the constant current circuit.

The fourth embodiment can be applied to not only one- and two-dimensional photoelectric conversion devices but also various photoelectric conversion devices.

In the photoelectric conversion device according to the fourth embodiment, even if the constant current circuit portion cannot be sufficiently shielded from light under limitations on the pattern layout and design rule of a semiconductor substrate, the problem that the constant current source circuit fails to operate normally upon irradiation of light can be solved.

As described above, according to the third and fourth embodiments, a semiconductor circuit and CMOS current mirror circuit capable of operating normally even upon irradiation of light can be realized. Especially, a photoelectric conversion device using the semiconductor circuit and CMOS current mirror circuit as a constant current source can be realized. Besides, more preferable operation can be attained by connecting the constant current sources 20B and 20C described in the third and fourth embodiments to the photodiode 5 described in the first and second embodiments.

[Fifth Embodiment]

An image reading apparatus using the photoelectric conversion device described in the third or fourth embodiment will be explained. The image reading apparatus of the fifth embodiment comprises at least a driving means for controlling operation of the photoelectric conversion device, the photoelectric conversion device described in the above embodiments, and a light source.

The image reading apparatus receives a start pulse, clock pulse, and the like output from an external CPU and the like as the driving means. Then, for example, the image reading apparatus starts scanning by the CPU or drives the light source or sensor in response to driving of the motor. An output signal from the photoelectric conversion device is processed by a signal processing means for shading correction, dark correction, and the like. The processed signal is input to the CPU.

In this way, the image reading apparatus having the photoelectric conversion device with the constant current source can be realized.

[Sixth Embodiment]

In the sixth embodiment, a multisensor in which a plurality of photoelectric conversion devices in each embodiment described above are arranged will be explained with reference to FIG. 8.

Figure 8:
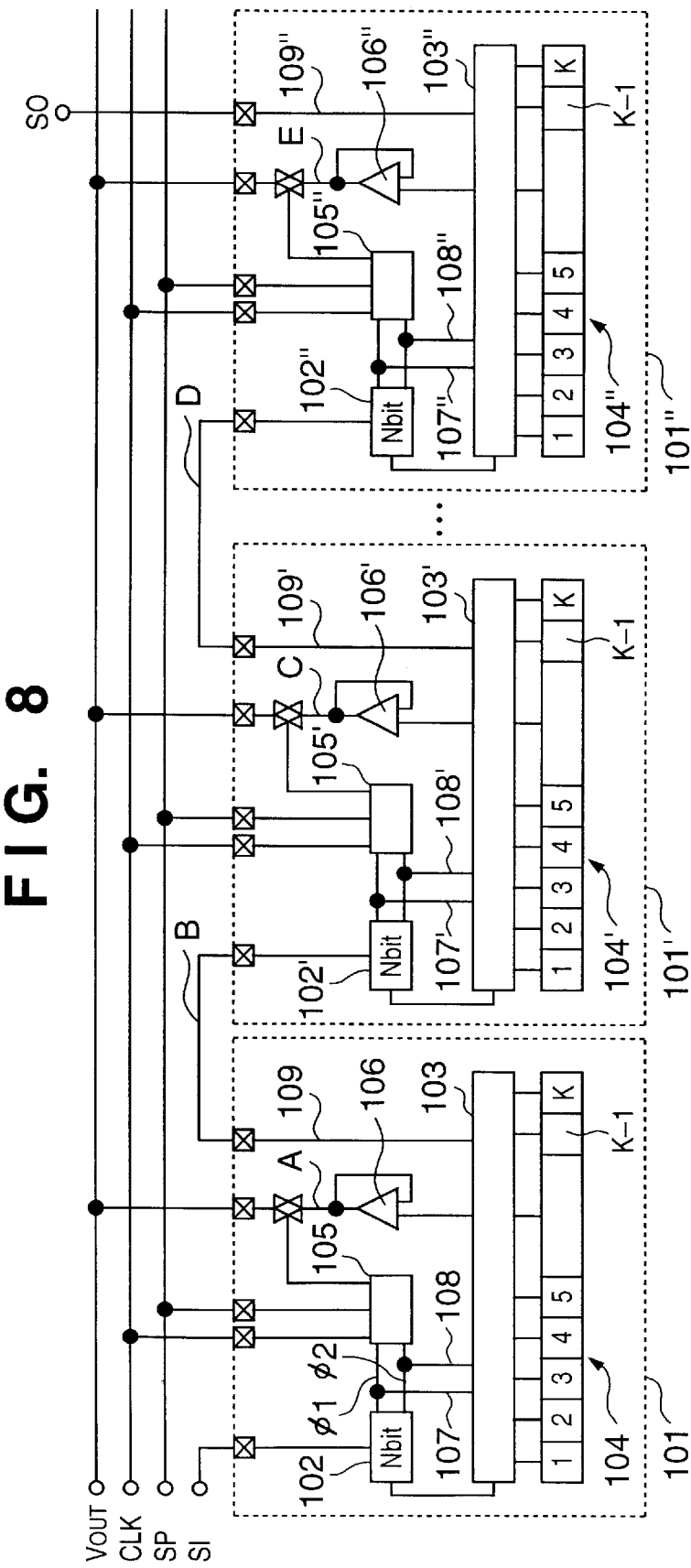
FIG. 8 is a circuit diagram showing the arrangement of a multisensor according to the sixth embodiment of the present invention.

On the multisensor shown in FIG. 8, photoelectric conversion devices 101, 101', and 101" described in each embodiment are mounted (on 15 chips in the sixth embodiment) and commonly connected to a clock CLK and start pulse SP for driving the photoelectric conversion devices. The photoelectric conversion devices 101, 101', and 101", respectively comprise N-bit delay means (N-bit pre-shift registers) 102, 102', and 1021", K-bit shift registers 103, 103', and 103" each corresponding to the shift register 22, K-bit light-receiving element arrays 104, 104', and 104" each corresponding to the light-receiving element array 23, timing generation circuits 105, 105', and 105", and signal output amplifiers 106, 106', and 106" each corresponding to the operational amplifier 24.

Next-chip start signal lines 109, 109', and 109" output signals N bits (K-N bits) before the end of a read from the bits of each photoelectric conversion device, as next-chip start signals N bits before the final registers of the shift registers 103, 103', and 103".

The timing generation circuits 105, 105', and 105" driven by the clock signal CLK and start pulse signal SP generate pulses for driving the light-receiving element arrays 104, 104', and 104", driving pulses φ1 107, 107', and 107" and φ2 108, 108', and 108" for driving the shift registers 103, 103', and 103". The start pulse signal SP is commonly connected to the respective image sensor chips in order to synchronize their operation start timings.

The signal output amplifiers 106, 106', and 106", amplify image signals read out from the light-receiving element arrays 104, 104', and 104" to one signal output line via switches which are turned on/off by shift signals from the shift registers. The signal output amplifiers 106, 106', and 106" output signal outputs Vout in accordance with control signals from the timing generation circuits 105, 105', and 105". Note that each of the signal output amplifiers 106, 106', and 106" incorporates a constant current circuit, starts supplying power at the same time as input of a start signal, and when receiving an N-bit clock signal from the start signal, performs steady amplification.

In arranging the photoelectric conversion device of each embodiment in the multisensor in FIG. 8, the constant current source 20, 20A, 20B, or 20C may be arranged for each photoelectric conversion device. Alternatively, one constant current source (e.g., in the first array of a light-receiving element arrays 104) may be commonly arranged, which can reduce the manufacturing cost.

[Seventh Embodiment]

In the seventh embodiment, an image sensor (image reading apparatus) having the multisensor described in the sixth embodiment will be explained with reference to FIG. 9.

Figure 9:
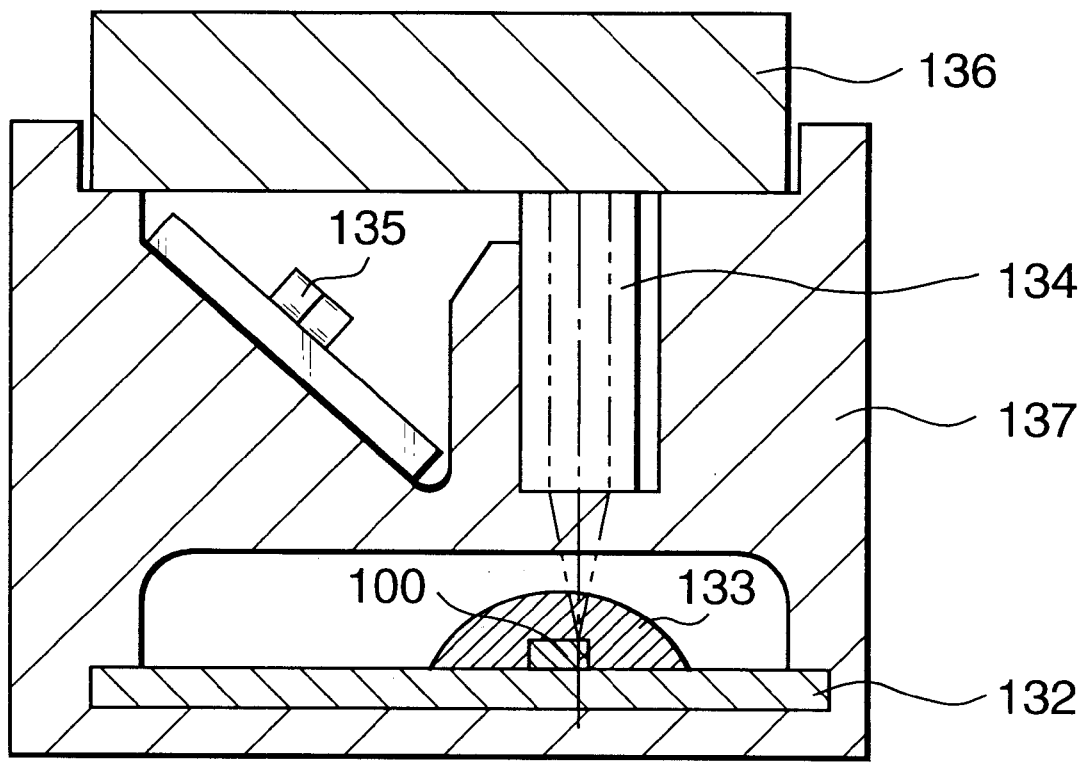
FIG. 9 is a sectional view showing the main part of the structure of an image sensor according to the seventh embodiment of the present invention.

The image sensor shown in FIG. 9 comprises a transparent support 136, an LED light source 135 for irradiating the support 136 with red, green, and blue light beams, a lens array 134 for focusing reflected light from an original into an image on the surface of the light-receiving element, a multisensor 100 on a ceramic board 132 that photoelectrically converts the reflected light focused by the lens array 134, a chip coating agent 133 made of a silicone resin or the like in order to protect the multisensor 100, and a housing 137. These components are assembled into a contact image sensor. The multisensor 100 corresponds to the multisensor shown in FIG. 8.

When the LED light source 135 emits only a red light beam, the image sensor shown in FIG. 9 drives the multisensor 100 to read red information of an original. Subsequently, the image sensor similarly reads green and blue information, and synthesizes the pieces of color information by general image processing using, e.g., a control unit (not shown). Accordingly, the image sensor can read a color original without any color filter.

In the seventh embodiment, a start signal SI for the first chip which is received by the control unit (not shown) for controlling driving of the contact image sensor is used to turn on the LED light source 135. A next-chip start signal SO for the shift register on the 15th chip is used to turn off the LED light source 135. Therefore, the LED light source 135 is ON only while all (15 in FIG. 8) photoelectric conversion devices on the mounting board 132 operate.

As many apparently widely different embodiments of the present invention can be made without departing from the spirit and scope thereof, it is to be understood that the invention is not limited to the specific embodiments thereof except as defined in the appended claims.

What is claimed is:

1. A photoelectric conversion device comprising a photoelectric conversion element driven by a current mirror circuit, said current mirror circuit having
   a first PMOS transistor having a source connected to a positive power supply,
   a second PMOS transistor having a source connected to the positive power supply and a gate and drain connected to a gate of said first PMOS transistor,
   a first NMOS transistor having a source connected to a reference potential and a gate and drain connected to a drain of said first PMOS transistor, and
   a second NMOS transistor having a source connected to the reference potential via a resistor, a gate connected to the gate of said first NMOS transistor, and a drain connected to the drain of said second PMOS transistor,
   said current mirror circuit having a photodiode with a cathode connected to the drain of said second PMOS transistor.

2. The device according to claim 1, wherein said photodiode receives a reverse bias.

3. The device according to claim 2, wherein said photodiode receives a reverse bias between the drain of said second PMOS transistor and the reference potential.

4. The device according to claim 1, further comprising a second current mirror circuit for flowing a current substantially identical to a current of said current mirror circuit, said second current mirror circuit having a third PMOS transistor, a fourth PMOS transistor having a source connected to a drain of said third PMOS transistor and an output terminal, and a drain connected to the reference potential, and a photodiode of a line sensor having an anode connected to a gate of said fourth PMOS transistor, and a cathode connected to the positive power supply.

5. The device according to claim 4, wherein said photoelectric conversion device includes a multisensor —in which a plurality of second current mirror circuits are arranged.

6. An image reading apparatus comprising, as a sensor for reading an image, said photoelectric conversion device serving as said multisensor defined in claim 5.

7. The device according to claim 1, wherein when light is incident on said photoelectric conversion element, a photocurrent generated in a drain region of said first PMOS transistor is larger than a photocurrent generated in a drain region of said first NMOS transistor.

8. The device according to claim 1, wherein when light is incident on said photoelectric conversion element, a photocurrent generated in a drain region of said second NMOS transistor is larger than a photocurrent generated in a drain region of said first PMOS transistor.

9. A photoelectric conversion device comprising a photoelectric conversion element driven by a current mirror circuit, said current mirror circuit having a first PMOS transistor having a source connected to a positive power supply, a second PMOS transistor having a source connected to the positive power supply and a gate and drain connected to a gate of said first PMOS transistor, a first NMOS transistor having a source connected to a negative power supply and a gate and drain connected to a drain of said first PMOS transistor, and a second NMOS transistor having a source connected to the negative power supply via a resistor, a gate connected to the gate of said first NMOS transistor, and a drain connected to the drain of said second PMOS transistor, said current mirror circuit having a photodiode with an anode connected to the drain of said first NMOS transistor.

10. The device according to claim 9, wherein said photodiode receives a reverse bias.

11. The device according to claim 10, wherein said photodiode receives a reverse bias between the drain of said first NMOS transistor and the positive power supply.

12. The device according to claim 9, further comprising a second current mirror circuit for flowing a current substantially identical to a current of said current mirror circuit, said second current mirror circuit having a third PMOS transistor, a fourth PMOS transistor having a source connected to a drain of said third PMOS transistor and an output terminal, and a drain connected to a reference potential, and a photodiode of a line sensor having an anode connected to a gate of said fourth PMOS transistor, and a cathode connected to the positive power supply.

13. The device according to claim 12, wherein said photoelectric conversion device includes a multisensor in which a plurality of second current mirror circuits are arranged.

14. An image reading apparatus comprising, as a sensor for reading an image, said photoelectric conversion device serving as said multisensor defined in claim 13.

15. The device according to claim 9, wherein when light is incident on said photoelectric conversion element, a photocurrent generated in a drain region of said first PMOS transistor is larger than a photocurrent generated in a drain region of said first NMOS transistor.

16. The device according to claim 9, wherein when light is incident on said photoelectric conversion element, a photocurrent generated in a drain region of said second NMOS transistor is larger than a photocurrent generated in a drain region of said first PMOS transistor.

17. A semiconductor device comprising a control circuit constituted by at least a first region of a first conductivity type and a second region of a second conductivity type, said control circuit including a semiconductor element in which when a potential variation occurs in either one of the first and second regions by external disturbance of said semiconductor device, a potential variation opposite to the potential variation is caused.

18. The device according to claim 17, wherein said control circuit constitutes a current mirror circuit by a plurality of PMOS transistors forming the first region of the first conductivity type and a plurality of NMOS transistors forming the second region of the second conductivity type, and said semiconductor device functions as a photoelectric conversion device by said current mirror circuit and a photoelectric conversion circuit connected to said circuit.

19. A photoelectric conversion device comprising a photoelectric conversion element driven by a current mirror circuit, said current mirror circuit having a first PMOS transistor having a source connected to a positive power supply, a second PMOS transistor having a source connected to the positive power supply and a gate and drain connected to a gate of said first PMOS transistor, a first NMOS transistor having a source connected to a reference potential and a gate and drain connected to a drain of said first PMOS transistor, and a second NMOS transistor having a source connected to the reference potential via a resistor, a gate connected to the gate of said first NMOS transistor, and a drain connected to the drain of said second PMOS transistor, wherein a current generated in a drain region of said first PMOS transistor is larger than a current generated in a drain region of said first NMOS transistor.

20. The device according to claim 19, wherein when light is incident on said photoelectric conversion element, a current generated in the drain region of said first PMOS transistor is larger than a current generated in the drain region of said first NMOS transistor, and the current is a photocurrent.

21. The device according to claim 19, wherein the drain region of said first PMOS transistor has a larger opening area than an opening area of the drain region of said first NMOS transistor.

22. The device according to claim 21, wherein said current mirror circuit and said photoelectric conversion element are formed on a single semiconductor substrate.

23. The device according to claim 19, wherein said current mirror circuit comprises a reverse-biased photodiode having a cathode connected to the drain of said second PMOS transistor.

24. The device according to claim 23, wherein said photodiode receives a reverse bias between the drain of said second PMOS transistor and the reference potential.

25. The device according to claim 19, wherein said current mirror circuit comprises a reverse-biased photodiode having an anode connected to the drain of said first NMOS transistor.

26. The device according to claim 25, wherein said photodiode receives a reverse bias between the drain of said first NMOS transistor and the positive power supply.

27. A photoelectric conversion device comprising a photoelectric conversion element driven by a current mirror circuit, said current mirror circuit having a first PMOS transistor having a source connected to a positive power supply, a second PMOS transistor having a source connected to the positive power supply and a gate and drain connected to a gate of said first PMOS transistor, a first NMOS transistor having a source connected to a reference potential and a gate and drain connected to a drain of said first PMOS transistor, and a second NMOS transistor having a source connected to the reference potential via a resistor, a gate connected to the gate of said first NMOS transistor, and a drain connected to the drain of said second PMOS transistor, wherein a current generated in a drain region of said second NMOS transistor is larger than a current generated in a drain region of said first PMOS transistor.

28. The device according to claim 27, wherein when light is incident on said photoelectric conversion element, a current generated in the drain region of said second NMOS transistor is larger than a current generated in the drain region of said first PMOS transistor, and the current is photocurrent.

29. The device according to claim 27, wherein the drain region of said second NMOS transistor has a larger opening area than an opening area of the drain region of said second PMOS transistor.

30. The device according to claim 29, wherein said current mirror circuit and said photoelectric conversion element are formed on a single semiconductor substrate.

31. The device according to claim 27, wherein said current mirror circuit comprises a reverse-biased photodiode having a cathode connected to the drain of said second PMOS transistor.

32. The device according to claim 31, wherein said photodiode receives a reverse bias between the drain of said second PMOS transistor and the reference potential.

33. The device according to claim 27, wherein said current mirror circuit comprises a reverse-biased photodiode having an anode connected to the drain of said first NMOS transistor.

34. The device according to claim 33, wherein said photodiode receives a reverse bias between the drain of said first NMOS transistor and the positive power supply.

35. A semiconductor circuit in which drain regions of P- and N-type field effect transistors are series-connected, and the drain region of said P-type field effect transistor is connected to a gate region of said P-type field effect transistor, wherein a photocurrent generated in the drain region of said N-type field effect transistor upon irradiation of light is larger than a photocurrent generated in the drain region of said P-type field effect transistor.

36. The circuit according to claim 35, wherein the drain region of said N-type field effect transistor has a larger opening area than an opening area of the drain region of said P-type field effect transistor.

37. A photoelectric conversion device comprising said semiconductor circuit defined in claim 35 and a light-receiving element connected to said semiconductor circuit.

38. A semiconductor circuit in which drain regions of P- and N-type field effect transistors are series-connected, and the drain region of said N-type field effect transistor is connected to a gate region of said N-type field effect transistor, wherein a photocurrent generated in the drain region of said P-type field effect transistor upon irradiation of light is larger than a photocurrent generated in the drain region of said N-type field effect transistor.

39. The circuit according to claim 38, wherein the drain region of said P-type field effect transistor has a larger opening area than an opening area of the drain region of said N-type field effect transistor.

40. A photoelectric conversion device comprising said semiconductor circuit defined in claim 38 and a light-receiving element connected to said semiconductor circuit.

41. A current mirror circuit comprising a semiconductor circuit in which drain regions of P- and N-type field effect transistors are series-connected and the drain region of said P-type field effect transistor is connected to a gate region of said P-type field effect transistor, and a semiconductor circuit in which the drain region of said N-type field effect transistor is connected to a gate region of said N-type field effect transistor, wherein source regions of P-type field effect transistors included in said two semiconductor circuits are connected via a power supply, gate regions of said P-type field effect transistors are connected to each other, and gate regions of N-type field effect transistors included in said semiconductor circuits are connected to each other, the drain region of said N-type field effect transistor has a larger opening area than an opening area of the drain region of said P-type field effect transistor, and the drain region of said P-type field effect transistor has a larger opening area than an opening area of the drain region of said N-type field effect transistor, and a photocurrent generated in the drain region of said N-type field effect transistor upon irradiation of light is larger than a photocurrent generated in the drain region of said P-type field effect transistor, and a photocurrent generated in the drain region of said P-type field effect transistor is larger than a photocurrent generated in the drain region of said N-type field effect transistor.

42. A photoelectric conversion device comprising said current mirror circuit defined in claim 41 and a light-receiving element connected to said current mirror circuit.

* * * * *

UNITED STATES PATENT AND TRADEMARK OFFICE
CERTIFICATE OF CORRECTION

PATENT NO. : 6,002,157
DATED : December 14, 1999
INVENTOR(S) : Hiraku Kozuka

It is certified that error appears in the above-identified patent and that said Letters Patent is hereby corrected as shown below:

Title page,
Under column [56], References Cited, in U.S. PATENT DOCUMENTS:

"Koruka et al." (all occurrences) should read -- kozuka et al. --.

Under Column [56], References Cited, in FOREIGN PATENT DOCUMENTS:

"European Pat. Off." (all occurrences) should read -- Japan --; and "1/1995" should read -- "2/1995" --.

Column 1
Line 18, "be-en" should read -- been --.

Column 8,
Line 10, "$V_{o2, \text{and } vo3}$." should read -- $V_{o2}$, and $V_{o3}$. --.

Signed and Sealed this

Twenty-eighth Day of August, 2001

*Attest:*

NICHOLAS P. GODICI
*Attesting Officer*   *Acting Director of the United States Patent and Trademark Office*